United States Patent [19]

Stephens

[11] 4,103,225

[45] Jul. 25, 1978

[54] SYSTEM AND METHOD FOR DETERMINING CAPACITANCE AND CABLE LENGTH IN THE PRESENCE OF OTHER CIRCUIT ELEMENTS

[75] Inventor: Berton H. Stephens, Los Altos, Calif.

[73] Assignee: Dynatel Corporation, Sunnyvale, Calif.

[21] Appl. No.: 757,030

[22] Filed: Jan. 5, 1977

[51] Int. Cl.² .................... G01R 27/26; G01R 31/08
[52] U.S. Cl. ................................. 324/60 CD; 324/52
[58] Field of Search .................. 324/52, 60 R, 60 C, 324/60 CD, 61 R

[56] References Cited

U.S. PATENT DOCUMENTS

| | | | |
|---|---|---|---|
| 2,455,543 | 12/1948 | Williams | 324/60 CD |
| 3,370,229 | 2/1968 | Hamburger et al. | 324/60 R |
| 3,452,272 | 6/1969 | Collins et al. | 324/60 CD |
| 3,453,535 | 7/1969 | Anglin | 324/60 CD |
| 3,530,379 | 9/1970 | Demerliac | 324/60 R |
| 3,612,997 | 10/1971 | Paulkovich | 324/60 C |
| 3,761,805 | 9/1973 | Dornberger | 324/60 C |
| 3,800,216 | 3/1974 | Hamilton | 324/52 |
| 3,824,459 | 7/1974 | Uchida | 324/60 CD |
| 3,944,914 | 3/1976 | Simmonds | 324/52 X |
| 4,032,841 | 6/1977 | Knippelmier | 324/60 CD |

Primary Examiner—Gerard R. Strecker
Attorney, Agent, or Firm—Flehr, Hohbach, Test, Albritton & Herbert

[57] ABSTRACT

Method and apparatus utilizing constant current charging and discharging to determine the capacitance of a telephone cable or other circuit element. An output signal corresponding to the time required to increase the voltage from a first level to a second level and back to the first level corresponds to the capacitance of the element and, in the case of a cable, the length of the cable.

12 Claims, 3 Drawing Figures

SYSTEM AND METHOD FOR DETERMINING CAPACITANCE AND CABLE LENGTH IN THE PRESENCE OF OTHER CIRCUIT ELEMENTS

BACKGROUND OF THE INVENTION

This invention pertains generally to the measurement of capacitance and more particularly to a method and apparatus for measuring the capacitance of an element such as a telephone cable.

In the past, there have been attempts to determine the location of an open circuit fault in a communication cable such as a telephone cable by measuring the capacitance of the cable from a known point to the open circuit and dividing the measured capacitance by the capacitance per unit length to determine the distance to the fault.

Heretofore, this approach has been subject to errors and limitations due to the presence of other circuit elements and foreign currents in the cable. Shunt conductance can arise, for example, by water entering a damaged cable and forming conductive paths between the conductors, and high series resistances can arise from conductors which are partly opened. Both the shunt conductance and the series resistance can adversely affect the measurement, and with shunt conductance, the measurements are subject to further error due to currents bridging from the undamaged conductors to the damaged conductors. Another source of foreign currents and error is alternating current induced in the cable from nearby power distribution lines.

SUMMARY AND OBJECTS OF THE INVENTION

The invention provides a method and apparatus which overcomes the aforementioned difficulties in determining the capacitance of a telephone cable or other circuit element. According to the invention, the element is charged with a current of constant magnitude from a first voltage level to a second voltage level, then discharged at a constant rate from the second level back to the first level. An output signal is provided in accordance with the time required to increase the voltage from the first level to the second level and back to the first level. This signal corresponds to the capacitance of the cable and therefore to the distance to the fault.

It is in general an object of the invention to provide a new and improved method and apparatus for measuring the capacitance of an element.

Another object of the invention is to provide a method and apparatus of the above character which are particularly suitable for use in locating an open circuit fault in a cable.

Another object of the invention is to provide a method and apparatus of the above character in which the element is charged and discharged at a constant current rate.

Additonal objects and features of the invention will be apparent from the following description in which the preferred embodiments are set forth in conjunction with the accompanying drawings.

DESCRIPTION OF THE PREFERRED EMBODIMENTS

Figure 1:
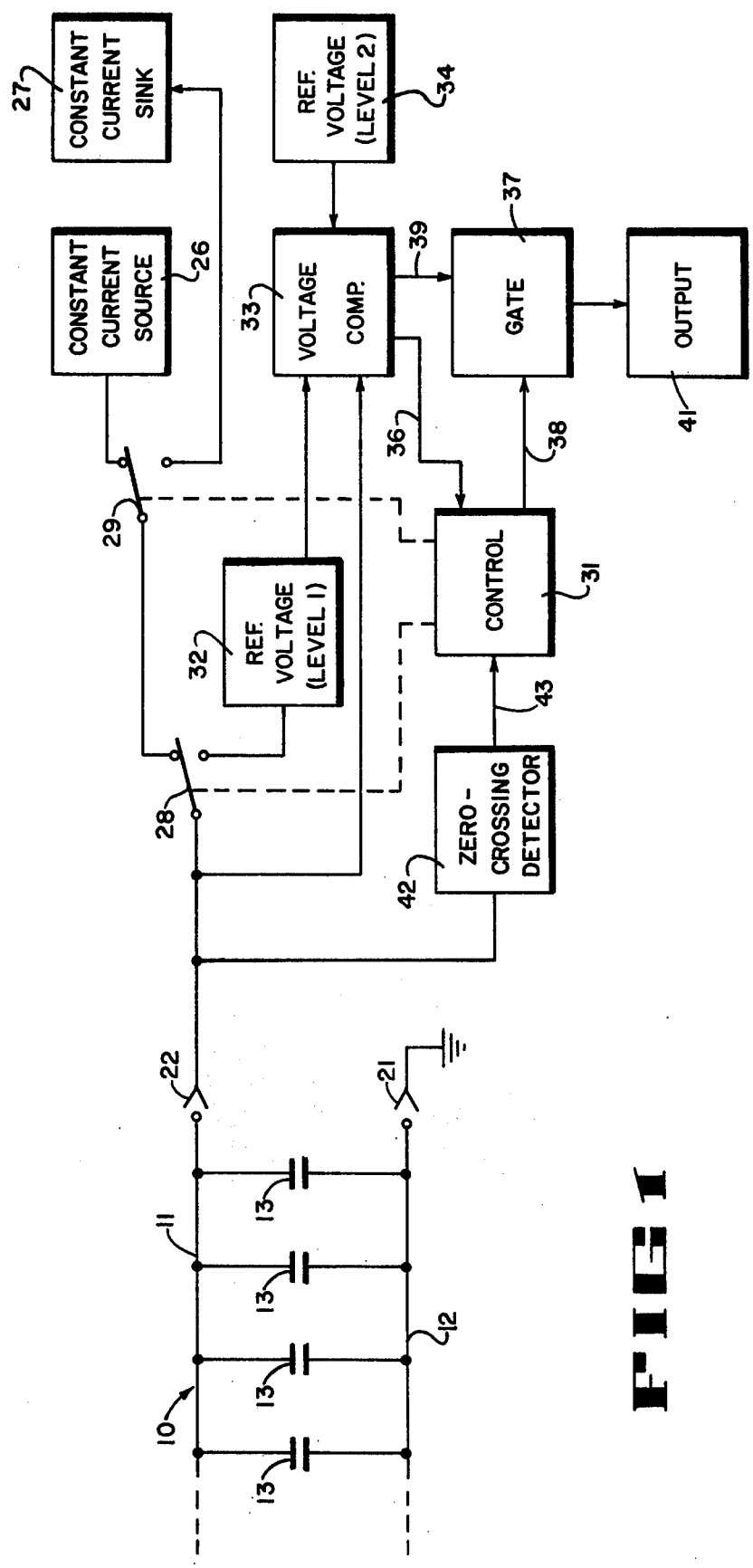
FIG. 1 is a block diagram of one embodiment of apparatus incorporating the invention.

In FIG. 1, the invention is illustrated in connection with a cable 10 comprising conductors 11, 12 with a distributed capacitance between the conductors represented by capacitors 13.

The capacitance measuring apparatus includes input terminals 21, 22, to which the conductors of cable 10 can be connected. As illustrated, terminal 21 is connected to the system ground, with other connections to this ground being omitted for ease of illustration.

Means is provided for charging and discharging a capacitive element connected to input terminals 21, 22 at a substantially constant current rate. This means includes a constant current source 26, a constant current sink 27, and single pole, two position switches 28, 29. Source 26 and sink 27 are of conventional design and are chosen to provide charging and discharging at suitable rates. Although illustrated as mechanical switches, switches 28, 29 are preferably electronic switches controlled by a control circuit 31. Input terminal 22 is connected to the armature of switch 28, and one terminal of this switch is connected to the armature of switch 29. One terminal of switch 29 is connected to the output of current source 26, and the second terminal of this switch is connected to the input of current sink 27. The second terminal of switch 28 is connected to the output of a reference voltage source 32.

A voltage comparator 33 is connected to input terminal 22 for monitoring the voltage on the cable. Comparator 33 receives a second input from reference voltage source 32 and a third input from a second reference voltage source 34. The comparator is of suitable known design for comparing the cable voltage with the reference voltages and delivering output signals to indicate when the cable voltage reaches the levels of the reference voltages.

A gate circuit 37 receives inputs from control circuit 31 and comparator 33 on lines 38, 39, respectively. The signal from the comparator serves as an enabling signal which conditions the gate to pass the signal from the control circuit to an output device 41 during the time the cable voltage is increasing from the level of source 32 to the level of source 34 and back to the level of source 32. Being dependent upon the time required to charge and discharge element 10 to given voltages, the output signal delivered to device 41 is proportional to the capacitance of the element. In the case of a cable, it is also proportional to the length of the cable. Output device 41 can, for example, comprise a meter calibrated in units of capacitance and/or length.

Means is provided for sensing the presence of an alternating current on cable 10 and synchronizing the application of the charging current to commence when the alternating current is at a zero-crossing point. This means includes a zero-crossing detector 42 connected to input terminal 22 and to control circuit 31.

Operation and use of the apparatus shown in FIG. 1, and therein the method of the invention, is as follows. Initially, switch 28 is actuated to connect input terminal 22 to voltage source 32. With the cable voltage at the level of source 32, switches 28, 29 are moved to the positions illustrated, following which the cable is charged by a current of substantially constant magnitude from source 26. When the cable voltage reaches the level of source 34, as determined by comparator 33, switch 29 is actuated to disconnect the current source and connect current sink 27 to the cable. When connected, the current sink serves to draw current from the cable at a substantially constant rate, thereby decreasing the voltage on the cable. When the voltage reaches the level of source 32, comparator 33 delivers signals to control circuit 31 and gate 37, and the discharging of the cable terminates. During the time the cable voltage is increasing from the level of source 32 to the level of source 34 and returning to the level of source 32, gate 37 is delivering an output signal to device 41. This signal corresponds to the capacitance and therefore, the length of the cable in the preferred embodiment, the measurement is made periodically at a suitable rate such as six times per second.

In the event that an alternating current is sensed on the cable, the application of the charging current is synchronized to commence at a zero-crossing of alternating current. Therefore, the alternating current has little or no effect on the measurement.

For cable fault location, the invention can be constructed in the form of a highly portable instrument which can be carried to the cable by hand. With the instrument connected to a convenient point on the cable and calibrated in accordance with the capacitance per unit length of the cable, output device 41 will indicate the distance from the point of connection to the open fault, and disturbances beyond the fault will have no effect on the reading.

Figure 2:
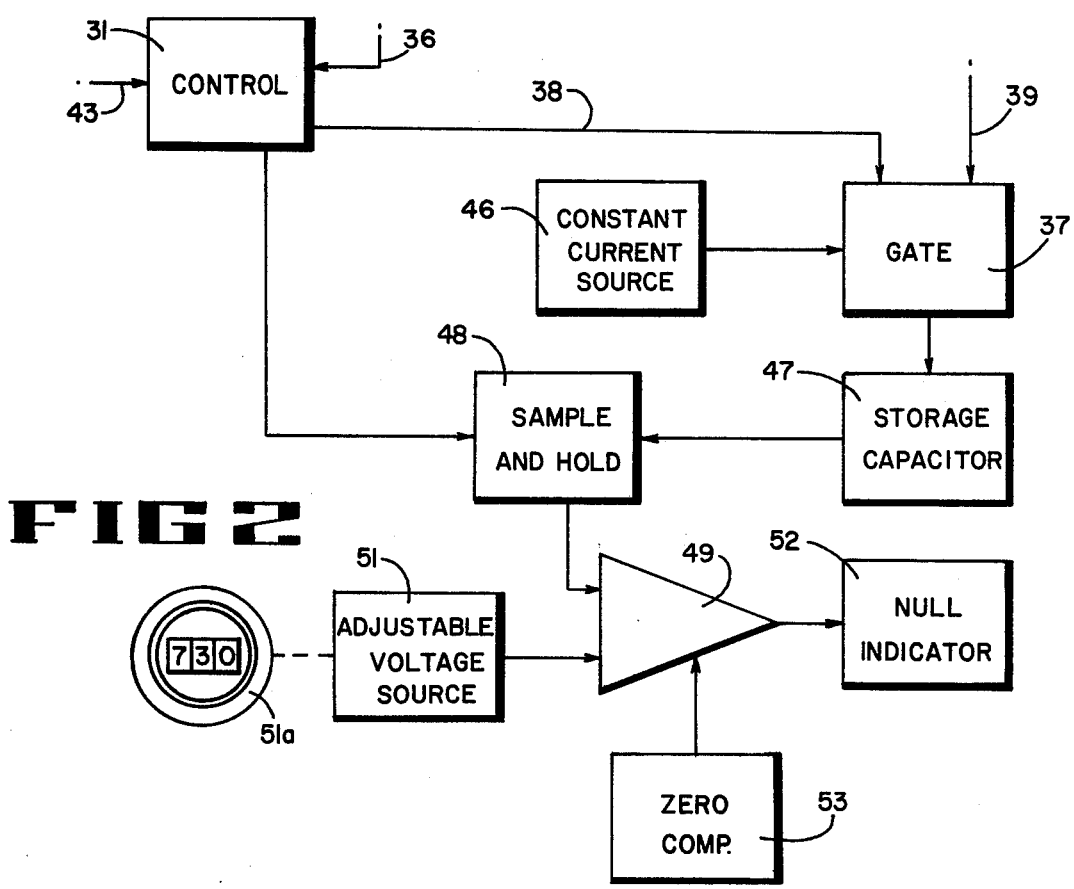
FIGS. 2 and 3 are block diagrams of alternative output circuits for the apparatus of FIG. 1.

In the embodiment of FIG. 2, gate circuit 37 controls the passage of a current from a constant current source 46 to a storage capacitor 47. A sample and hold circuit 48 is connected to the storage capacitor, and control circuit 31 conditions the sample and hold circuit to store the capacitor voltage at the end of each measurement period, e.g. when the cable voltage returns to the level of source 32.

The output of sample and hold circuit 48 is connected to one input of a differential amplifier 49. This amplifier receives a second input from an adjustable voltage source 51, and the output of the amplifier is connected to a null indicator 52. The voltage source includes a control dial 51a which, in the embodiment illustrated, is a digital dial having three display wheels which advance as the dial is turned. For cable fault location, voltage source 51 is calibrated so that the dial reads directly in units of length. A zero compensator 53 supplies an offset voltage to amplifier 49 to eliminate errors due to stray capacitance in the measuring system, including any test leads utilized for interconnecting the input terminals and the cable under test.

Operation and use of the embodiment of FIG. 2 is generally similar to that described above. However, at the outset of a measurement, before the cable is connected to input terminals 21, 22, dial 51a is set to 000, and zero compensator 53 is adjusted to provide a null reading on indicator 52, thereby cancelling the effect of any stray capacitance in the system. Thereafter, during each measurement period, storage capacitor 47 is charged with current from source 46 to a voltage level determined by the time required to charge and discharge the cable connected to the input terminals. This level corresponds to the capacitance and, therefore, the length of the cable. At the end of each measurement period, the voltage on capacitor 47 is stored in sample and hold circuit 48 and applied to one input of differential amplifier 49. Dial 51a is then adjusted to provide a null indication, at which time the length of the cable can be read directly from the dial.

Figure 3:
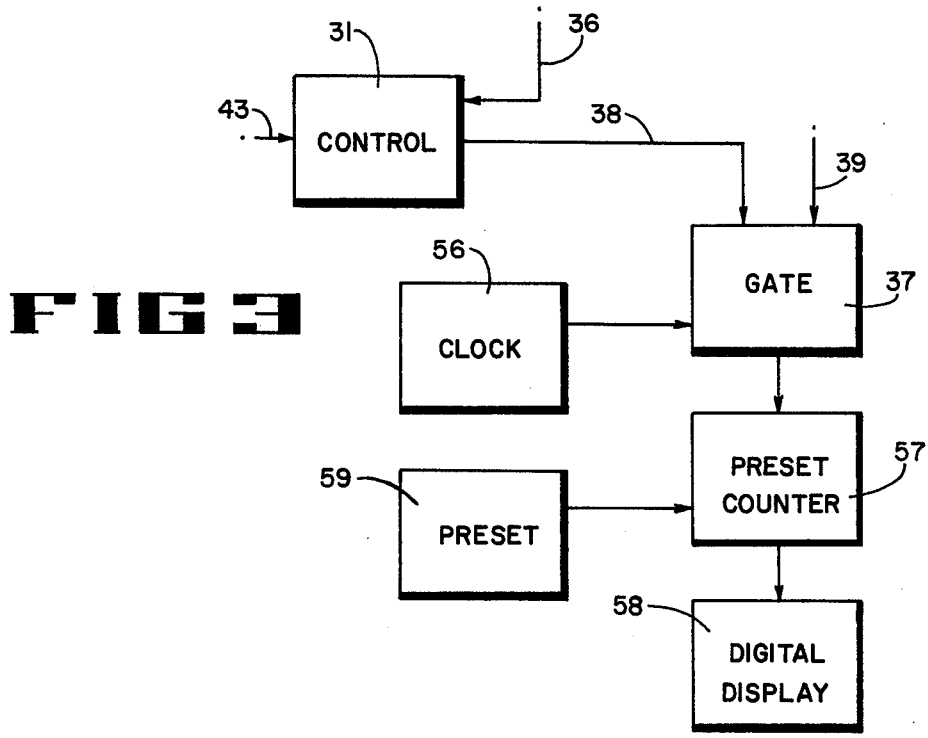

In the embodiment of FIG. 3, gate 37 controls the passage of pulses from a clock source 56 to a presettable counter 57, and the count is displayed by a digital display 58. In the preferred embodiment, the system is calibrated so that the display reads directly in units of length, and a preset control 59 is connected to the PRESET inputs of the counter to provide means for correcting errors due to stray capacitance in the system.

Operation and use of the embodiment of FIG. 3 is generally similar to that of the preceding embodiments. At the outset of a measurement, preset control 59 is adjusted to offset the effects of any stray capacitance and provide a zero reading on display 58. During each measurement period, gate 37 passes clock pulses to the counter during the time that the cable is charging and discharging. At the end of each period, the count is displayed to indicate the length of the cable.

The invention has a number of important features and advantages. It provides a method and apparatus for measuring capacitance, which are relatively immune to errors arising from the presence of other elements and foreign currents. Any time perturbations are averaged out by charging and discharging the cable or other element under test during each measurement period. As noted above, the invention is particularly useful in determining the locations of open faults in cables.

From the foregoing, it is apparent that a new and improved method and apparatus for measuring capacitance and locating cable faults have been provided. While only certain presently preferred embodiments have been described, as will be apparent to those familiar with the art, certain changes and modifications can be made without departing from the scope of the invention as defined by the following claims.

What is claimed is:

1. In a method for determining the length of an electrical cable having a predetermined capacitance per unit length, the steps of: applying a charging current of constant magnitude to the cable to increase the voltage across the cable from a first predetermined level to a second predetermined level, effecting a constant current discharging of the cable to decrease the voltage from the second level to the first level, monitoring the level of the voltage across the cable, and delivering an output signal corresponding to the time required to increase the voltage from the first level to the second level and back to the first level, said output signal being proportional to the capacitance and, therefore, the length of the cable.

2. The method of claim 1 further including the steps of sensing the presence of an alternating current on the cable and synchronizing the application of the charging current to commence when the alternating current is at a zero-crossing.

3. The method of claim 1 further including the steps of storing the output signal, providing a reference signal, adjusting the level of the reference signal with a dial calibrated in units of length, monitoring the relative levels of the reference signal and the output signal, and reading the length of the cable from the dial when the reference signal bears a predetermined relationship to the output signal.

4. The method of claim 1 wherein the output signal is in digital form and is displayed to indicate the length of the cable.

5. In apparatus for determining the length of an electrical cable having a predetermined capacitance per unit length: means for applying a charging current of constant magnitude to the cable to increase the voltage across the cable from a first predetermined level to a second predetermined level, a constant current load, means for connecting the load to the cable to effect a constant current discharging of the cable to decrease the voltage from a second level to the first level, means for monitoring the level of the voltage across the cable, and means for delivering an output signal corresponding to the time required to increase the voltage from the first level to the second level and back to the first level, said output signal being proportional to the capacitance and, therefore, the length of the cable.

6. The apparatus of claim 5 further including means for sensing the presence of an alternating current on the cable and synchronizing the application of the charging current to commence when the alternating current is at a zero-crossing.

7. The apparatus of claim 5 further including means for storing the output signal, a reference signal source having an adjusting dial calibrated in units of length, and means for monitoring the relative levels of the reference and output signals, whereby the length of the cable can be read directly from the dial when the reference signal bears a predetermined relationship to the output signal.

8. The apparatus of claim 5 wherein the means for delivering the output signal includes a source of clock pulses, a counter, and means responsive to the level of the cable voltage for applying clock pulses to the counter during the time the voltage is increasing from the first level to the second level and returning to the first level.

9. In a method for determining the capacitance of an electrical element, the steps of: applying a charging current of constant magnitude to the element to increase the voltage across the same from a first predetermined level to a second predetermined level, effecting a constant current discharge of the element to decrease the voltage from the second level to the first level, monitoring the level of the voltage across the element, and delivering an output signal corresponding to the time required to increase the voltage from the first level to the second level and back to the first level, said output signal being proportional to the capacitance of the element.

10. The method of claim 9 further including the steps of sensing the presence of an alternating current on the element and synchronizing the application of the charging current to commence when the alternating current is at a zero-crossing.

11. In apparatus for determining the capacitance of an electrical element: means for applying a charging current of constant magnitude to the element to increase the voltage across the same from a first predetermined level to a second predetermined level, a constant current load, means for connecting the load to the element to effect a constant current discharge of the element to decrease the voltage from the second level to the first level, means for monitoring the level of the voltage across the element, and means for delivering an output signal corresponding to the time required to increase the voltage from the first level to the second level and to return the voltage back to the first level, said output signal being proportional to the capacitance of the element.

12. The apparatus of claim 11 further including means for sensing the presence of an alternating current on the element and synchronizing the application of the charging current to commence when the alternating current is at a zero-crossing.

* * * * *